United States Patent
Teneketges et al.

(10) Patent No.: US 7,187,549 B2
(45) Date of Patent: Mar. 6, 2007

(54) HEAT EXCHANGE APPARATUS WITH PARALLEL FLOW

(75) Inventors: Nicholas J. Teneketges, Thousand Oaks, CA (US); Tarzen Kwok, Thousand Oaks, CA (US)

(73) Assignee: Teradyne, Inc., Boston, MA (US)

( * ) Notice: Subject to any disclaimer, the term of this patent is extended or adjusted under 35 U.S.C. 154(b) by 64 days.

(21) Appl. No.: 10/882,433

(22) Filed: Jun. 30, 2004

(65) Prior Publication Data

US 2006/0002086 A1   Jan. 5, 2006

(51) Int. Cl.
*H05K 7/20* (2006.01)
(52) U.S. Cl. .................. 361/699; 361/689; 174/15.1; 165/80.4; 165/104.33; 257/714
(58) Field of Classification Search ........ 361/687–690, 361/698, 699, 711, 719, 721; 257/714, 716; 174/15.1; 165/80.3, 104.33; 62/259.2
See application file for complete search history.

(56) References Cited

U.S. PATENT DOCUMENTS

| | | | | |
|---|---|---|---|---|
| 5,144,531 | A | * | 9/1992 | Go et al. ................ 361/702 |
| 5,218,515 | A | | 6/1993 | Bernhardt |
| 5,309,319 | A | * | 5/1994 | Messina ................ 361/699 |
| 5,477,160 | A | * | 12/1995 | Love ................... 324/755 |
| 5,509,468 | A | * | 4/1996 | Lopez .................. 165/144 |
| 5,823,005 | A | * | 10/1998 | Alexander et al. ....... 62/259.2 |
| 5,871,042 | A | | 2/1999 | Gutfeldt et al. |
| 6,055,157 | A | * | 4/2000 | Bartilson ............... 361/699 |
| 6,208,510 | B1 | | 3/2001 | Trudeau et al. |
| 6,536,510 | B2 | * | 3/2003 | Khrustalev et al. .... 165/104.33 |
| 6,714,412 | B1 | * | 3/2004 | Chu et al. .............. 361/699 |
| 6,760,221 | B2 | * | 7/2004 | Goth et al. ............. 361/699 |
| 6,807,056 | B2 | * | 10/2004 | Kondo et al. ........... 361/689 |
| 6,828,675 | B2 | * | 12/2004 | Memory et al. .......... 257/714 |
| 6,888,720 | B2 | * | 5/2005 | Pfister et al. ........... 361/689 |
| 2004/0189280 | A1 | | 9/2004 | Mirkhani et al. | |

FOREIGN PATENT DOCUMENTS

| | | |
|---|---|---|
| GB | 1 491 570 A | 11/1977 |
| GB | 1 517 650 A | 7/1978 |

OTHER PUBLICATIONS

IBM Technical Disclosure Bulletin vol. 21, No. 8 Jan. 1979, pp. 3378-3380.*
IBM Technical Disclosure Bulletin vol. 25, No. 9 Feb. 1983, p. 4517.*
IBM Technical Disclosure Bulletin vol. 30, No. 5 Oct. 1987, p. 413.*

* cited by examiner

*Primary Examiner*—Boris Chervinsky
(74) *Attorney, Agent, or Firm*—Eric J. Aagaard, Esq.; Christopher R. Balzan, Esq.

(57) ABSTRACT

In at least one embodiment, the present invention is a heat exchange apparatus which includes at least one heat exchanger, an intake manifold, and at least one multichip module. Where the intake manifold is in fluid communication with each heat exchanger and where the intake manifold is capable of providing the heat exchange medium separately to each heat exchanger. Where the each multichip module is positioned at least adjacent to at least one heat exchanger, such that heat can transfer between each multichip module and at least one heat exchanger.

25 Claims, 3 Drawing Sheets

HEAT EXCHANGE APPARATUS WITH PARALLEL FLOW

BACKGROUND

Automated test equipment, or ATE, provides semiconductor manufacturers the capability of individually testing each and every semiconductor device fabricated during production. The testing is usually carried out at both the wafer level and the packaged-device level to ensure operability of the devices before reaching the marketplace.

Modern semiconductor devices typically have anywhere from thirty-two to over one-thousand pins, generally requiring a corresponding number of channels in the semiconductor tester to thoroughly verify the operation of the device. Each channel usually comprises a signal path including the necessary pin electronics for sending and/or receiving test signals to and from a pin on the DUT. In conventional testers, to maximize component density and minimize the size of the tester, the channels are often formed on printed circuit boards resident within a testhead. The testhead is separated from the main body of the tester for coupling to the DUTs that are mounted on a prober or handler.

Because of the relatively high concentration of circuit boards within a conventional testhead, specialized cooling systems are generally employed to maintain a stable thermal environment. Some prior systems have employed air cooling, which typically includes elaborate ducting that takes up valuable space within the testhead. As a result, these air cooling systems contribute to a larger overall footprint for the tester. Moreover, because the airflow must overcome the resistive effects of ducting, nozzles and the uneven shapes and surfaces of the boards, the air cooled systems tend to not be as efficient as desired.

Other approaches have included liquid cooling systems that circulate a fluid, typically water, from a liquid cooler, i.e. a refrigeration unit, and past the heat producing electronic components, i.e. microchips, and back to the cooler. Liquid is passed through cooling blocks, which are attached to the electronic components, to allow the heat to transfer from the components to the liquid. In these systems, the cooling blocks are attached to one another with tubes or hoses, in series to form a single path or channel for the liquid to pass though. That is, these systems flow the liquid from the cooling unit, which typically includes a pump, to a first cooling block, where heat is transferred from the electronic component, which the cooling block is mounted on, into the liquid. Then the liquid leaves the first cooling block through a connecting tube to a second cooling block, where heat is again transferred into the liquid from another electronic component. The liquid continues to move through a series of cooling blocks in succession, having heat transferred into it at each cooling block, until it returns to the cooling unit.

Because the liquid is heated each time it passes through a cooling block, the temperature varies unpredictably with each cooling block in the series of cooling blocks. That is, with such cooling systems each electronic component will be operating at a different temperature, with the temperature rising along the path of the liquid through the cooling blocks.

Lately, the trend has been with modern electronic components, especially those used in current automated test equipment, of becoming more and more sensitive to temperature levels, and any fluctuations thereof. To optimize performance of these components and to obtain uniform performance with among a set of components, a stable and common temperature level is desired across all the components. This is difficult to achieve with the variable liquid temperatures provided by the prior liquid cooling systems.

Therefore, a need exists for a cooling system that provides an uniform, predictable and consistent cooling environment for each of the electronic components being cooled. Such a system should allow for ease of access to reduce the time needed for servicing and, as a result, minimize overall equipment downtime.

SUMMARY

In at least one embodiment, the present invention is a heat exchange apparatus which includes at least one heat exchanger, an intake manifold, and at least one multichip module. Where the intake manifold is in fluid communication with each heat exchanger and where the intake manifold is capable of providing the heat exchange medium separately to each heat exchanger. Further, each multichip module is positioned at least adjacent to at least one heat exchanger, such that heat can transfer between each multichip module and at least one heat exchanger.

The heat exchange apparatus can also include an exhaust manifold. The exhaust manifold is in fluid communication with each heat exchanger and is capable of receiving the heat exchange medium from each of the heat exchangers. Also, the intake manifold can be capable of providing the heat exchange medium substantially equally to each heat exchanger.

Each multichip module can abut, be mounted to, and/or be compression mounted to at least one heat exchanger. Each multichip module can include a pin electronics die which itself abuts at least one heat exchanger.

The heat exchangers can be cold plates or other similar structures. The heat exchange medium can be a liquid and/or an inert liquid. The heat exchanger system can also include at least one first connector. Where each first connector is positioned between the intake manifold and each heat exchanger, such that each heat exchanger can be disconnected from the intake manifold. Likewise, the heat exchanger system can include at least one second connector. Where each second connector is positioned between the exhaust manifold and each heat exchanger, such that each heat exchanger can be disconnected from the exhaust manifold.

In another embodiment, the invention is in a piece of automated test equipment having a printed circuit board, a plurality of multichip modules mounted to the printed circuit board, a coolant source for providing a liquid coolant, a coolant receptor for receiving a liquid coolant, and a liquid cooling apparatus. The liquid cooling apparatus is in fluid communication with the coolant source and the coolant receptor. The liquid cooling apparatus includes: a plurality of cold plates, wherein each cold plate abuts a multichip module, such that heat is capable of transferring between each multichip module and its abutting cold plate; an intake manifold positioned at least adjacent to the printed circuit board, wherein the intake manifold is in fluid communication with each cold plate in a parallel configuration, such that the intake manifold is capable of providing coolant to each cold plate separately; and an exhaust manifold positioned at least adjacent to the printed circuit board, wherein the exhaust manifold is in direct fluid communication with each cold plate in a parallel configuration, such that the exhaust manifold is capable of receiving coolant from each cold plate separately.

The liquid cooling apparatus can also include an intake connector mounted between the coolant source and the intake manifold, wherein the intake connector is capable of separating a fluid connection between the intake manifold and the coolant source, such that the liquid cooling apparatus is separable from the coolant source and an exhaust connector mounted between the exhaust manifold and the coolant receptor, wherein the exhaust connector is capable of separating a fluid connection between the exhaust manifold and the coolant receptor, such that the liquid cooling apparatus is separable from the coolant source.

In another embodiment of the present invention, a heat exchange device includes a printed circuit board, a multichip module mounted on the printed circuit board, a cold plate positioned on the multichip module, and a fastener connecting the printed circuit board and the cold plate. Where the fastener urges the cold plate against the multichip module and the multichip module against the printed circuit board. The cold plate can be positioned to form a lid to the multichip module. The cold plate can also be a compression plate.

BRIEF DESCRIPTION OF THE DRAWINGS

The features and advantages of the present invention will be better understood with regard to the following description, appended claims, and accompanying drawings where:

DESCRIPTION

The present invention includes a heat exchange system which functions to provide an even distribution of the heat exchange medium across each of the heat exchangers. This distribution can include providing even pressures, flow rates as well as temperatures and composition of the medium. This distribution allows the flows of the medium to be predictable and consistent through each of heat exchangers. In turn, an even heat exchange capacity, i.e. heat transfer rate, over each of the heat exchangers is achieved. As such, the temperatures of each of the heat exchangers, and therefore the electronic components attached thereto, can be kept at the same temperature, or within a relatively narrow range of temperatures.

The even distribution of the heat exchange medium is achieved in part with use of an intake manifold and an exhaust manifold. By having each of heat exchangers attached to a single common supply of the heat exchange medium, the distribution to each heat exchanger can be kept even.

The ability of the parallel heat exchange system to keep the heat transfer, and thus the temperature, the same across all of the heat exchanges and their associated electronic components, is in direct contrast to the serial cooling systems, described above. Because a serial system flows coolant through one cooling block after another, in succession, the conditions, i.e. temperature, of the coolant will be altered after passing through each cooling block. As a result, the temperatures across the cooling blocks vary along the path of the flow of the coolant.

In temperature sensitive applications, such as cooling of electronic components, i.e. chip modules, the heat exchange systems must be capable of maintaining relative constant temperatures on each component. Failure to do so can result in dramatic reductions, or errors, in performance, and/or damage to the components. More specifically, adverse temperatures can affect timing signals of chips, and, due to increased electrical resistance, certain analog functions, as well as increased noise.

On the other hand, predictability in cooling allows for more efficient component designs, thereby increasing performance and lowering costs. With narrower operating temperature ranges, components can be designed to operate at higher frequencies and to use less power.

With multichip modules, or MCMs, used in automated test equipment, or ATE, sensitive pin electronics die used within the MCM typically can not meet their performance specifications without tightly controlling their operating temperatures. In some embodiments of the present invention, the temperature range of the MCMs have been found to be able of being maintained within a ±1° C. temperature range.

Figure 1:
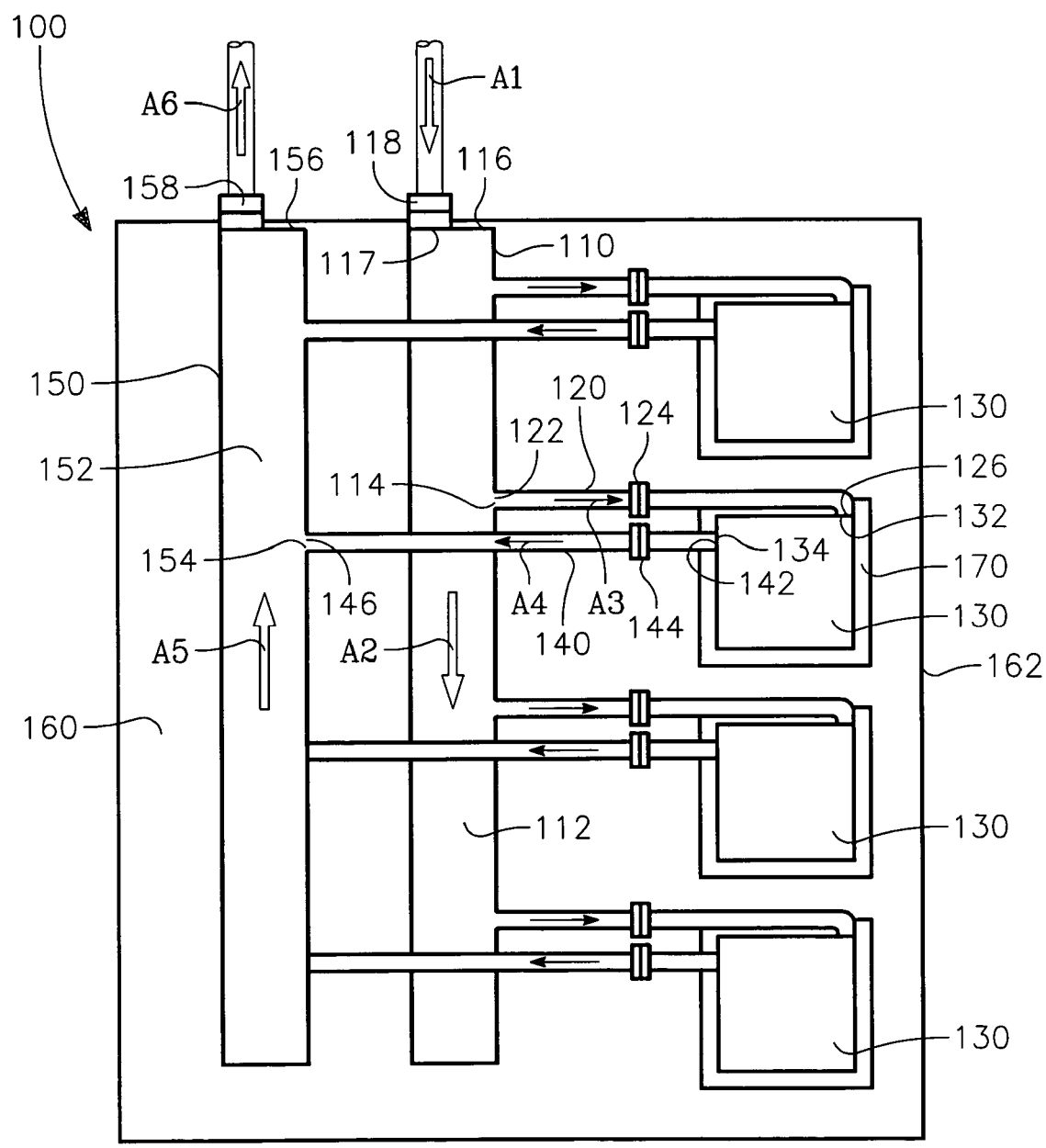
FIG. 1 shows a top cut-away view of a parallel heat exchange system in accordance with at least one embodiment of the present invention.

FIG. 1 shows a top view cut-away of a parallel heat exchange system in accordance with at least one embodiment of the present invention. As shown, a heat exchange or cooling system 100 is positioned on a printed circuit board or card 160, such that it is capable of cooling each of the components or devices 170. By being arranged to supply cooling to each of the devices in a parallel arrangement, the heat exchange system 100 is capable of maintaining the temperature of each device at the same, or at least substantially the same, temperature. That is, all the devices can be keep in a relatively narrow common range of temperatures. This can result in improved and more uniform performance and provide a more common life span of each device, reducing the overall amount of servicing required.

The cooling system 100 includes an inlet or intake manifold 110, inlet or intake tubes or hoses 120, heat exchangers 130, outlet or exhaust tubes or hoses 140 and an outlet or exhaust manifold 150. The card 160 includes an edge 162. The devices 170 are mounted on the card 160 adjacent the edge 162. The flow directions of the heat exchange medium (not shown), in this embodiment, are shown generally by the arrows A1, A2, A3, A4, A5 and A6.

The intake manifold 110 functions to allow an incoming flow of the heat exchange medium to be evenly distributed over a set of tubing connected to the manifold 110. The intake manifold 110 includes a common or distribution region 112, openings 114, and an open end 116. The general flow direction of the heat exchange medium through the intake manifold 110 is shown by the arrow A2.

Depending on the embodiment, the intake manifold 110 can be mounted on the card 160, positioned over the card 160, or positioned adjacent to the card 160. With the intake manifold 110 mounted on to the card 160 it allows the heat exchange system 100 and the card 160 to be a single unit, making installation, removal and servicing of the combined unit easier and quicker. Which in turn can reduce the time and cost of maintenance and repair.

The heat exchange medium used in the present invention can be any of a variety of substances including a liquid or a gas. Usable liquids include inert fluids and other fluids, such as water, flourinert dielectric fluid, HFE and FC77 both available from 3M corp. of St. Paul, Minn. Usable gases include air, helium, as well as other gases. In the embodiment shown in FIG. 1 an inert fluid can be used as the heat exchange medium.

The distribution region 112 receives the heat exchange medium from an external source (not shown), such as a cooling system, a refrigeration unit, a heat exchanger, a heater, pump, reservoir or the like. As the medium moves into the distribution region 112, it is applied evenly to each of the openings 114. The specific size and shape of the distribution region 112 can vary and depending on factors including the flow rates into and out of the distribution region 112, and the properties of the heat exchange medium, i.e. pressure, compressibility, viscosity, and the like. In some embodiments, as shown, the distribution region 112 is significantly larger in cross-section than the openings 114 and the opening of the open end 116. This allows the flow rate of the heat exchange medium to reduce upon entering the distribution region 112 and facilitates even distribution to the openings 114.

The openings 114 are positioned along the intake manifold 110 and function to allow flow to be directed into each of the intake tubes 120 attached thereto. While shown being positioned along a common side of intake manifold 110, in other embodiments the openings 114 can be on other sides, or about the manifold 110. While the size and shape of the openings 114 can vary, to achieve a balanced and even flow through each of the openings, the openings 114 typically have a common size and shape. The particular size and shape of the openings 114 is dependent on the particular application and can vary depending on factors including the desired flow rate through the openings 114, and the properties of the heat exchange medium, as noted above.

The intake manifold 110 also includes the open end 116, which has an opening 117, allowing the flow of heat exchange medium into the manifold 110 from an external source (not shown). The external source can be a coolant source. The size and shape of the opening 117 can vary depending on the embodiment, and on factors including the flow rate and the properties of the heat exchange medium. The open end 116 can also include a connector or intake connector 118, which functions to attach the tube or hose from the external source to the intake manifold 110. The connector 118 can include a valve, or valves, to prevent or limit any leakage of the heat exchange medium. The connector 118 can also be positioned away from the open end 116 along the tube from the external source. The connector 118 can be a quick-disconnect connector to allow the external source tube to be relatively quickly disconnected from the manifold 110. Such a quick-disconnect connector facilitates the quick removal of the card 160 from a test head, or any similar apparatus. This in turn allows for reduced service time and less equipment down time. Also, this provides more flexibility in allowing individual cards to be serviced without impacting other cards in the equipment.

The intake tubes 120 are connected between the intake manifold 110 and the heat exchangers 130, and function to carry the heat exchange medium therebetween. Each intake tube 120 includes an inlet 122 and an outlet 126. The general flow direction is shown by the arrow A3. The intake tubes 120 can be of any of a variety of different materials including rubber, stainless steel, aluminum, plastic, vinyl, and copper. The intake tubes 120 can be compliant and/or flexible tubing which may be required for adjusting the alignment of the any connectors placed along the intake tubes 120, as described below.

The size and shape of the intake tubes 120 can vary depending on the particular application. Factors including the desired flow rate and the properties of the heat exchange medium determining the size and shape used for the intake tubes 120. The outlet 126 is shown being attached to the heat exchanger 130 along one of its sides, however, the outlet 126 can be attached to heat exchanger 130 at any of a variety of different points about the heat exchanger 130, depending on the particular configuration of the inlet and outlet of the heat exchanger 130.

Between the inlet 122 and the outlet 126, the intake tube 120 can include a connector or first connector 124 which allows the intake tube 120 to be separated into two portions on either side of the connector 124. The connector 124 can include a valve, or valves, to prevent or limit any leakage of the heat exchange medium. The connector 124, along with a similar connector on the exhaust tubes 140, as detailed below, allows the heat exchanger 130 to be removed from cooling system 100 without removing the rest of the cooling system 100 from the card 160. As a result, the heat exchanger 130 may be removed to facilitate access to the device 170 or structure being cooled by the heat exchanger 130, i.e. a MCM, as shown. This allows individual components to be serviced without impacting other components on the board. Also, with the heat exchanger 130 and the device 170 being mounted to each other in an integrated unit, as detailed below, the connector 124 facilitates the removal of the unit from the channel card 160. The connector 124 can be a quick-disconnect connector such as a QD connector available from Eaton Aeroquip, Inc. located in Maumee, Ohio. The use of such a quick-disconnect further reduces the time and effort need to disconnect the tube. In turn, this further reduces the service time and equipment down time. In some embodiments, the connector 124 is referred to as an inlet cold plate connector.

The heat exchanger 130 functions to transfer heat between device it is positioned with, i.e. mounted upon, and the heat exchange medium. In some embodiments, as that shown, the heat exchanger 130 functions to cool the device 170 that is positioned under the heat exchanger 130. In certain embodiments, the device 170 has the coldplate bonded such that the cold plate is in close proximity to components of the device, i.e. the bare or exposed dies in an MCM. As noted above and as further detailed below, the heat exchanger 130 and the device 170 can be mounted together in an integrated unit.

The size and shape of the heat exchanger 130 can vary depending on the requirements of the particular application. For example, the size of the heat exchanger can be directly dependent on the amount of heat that must be transferred from the device it is mounted to, and the device's surface area available for the heat transfer. The heat exchanger 130 can be a cold plate with a variety of different configurations, as further described below.

The heat exchanger 130 includes an inlet 132 and an outlet 134, which depending on the configuration of the heat exchanger 130, can be located at different positions about the heat exchanger 130.

The heat exchanger 130 can be of any of a variety of different materials which aid in the heat transfer, including materials with high heat transfer rates such as copper, brass, aluminum and the like.

The exhaust tubes 140 are connected between the heat exchangers 130 and the exhaust manifold 150, and function to carry the heat exchange medium therebetween. Each exhaust tube 140 includes an inlet 142 and an outlet 146. The general flow direction is shown by the arrow A4. The exhaust tubes 140 can be of any of a variety of different materials including rubber, stainless steel, aluminum, plastic, vinyl, copper. The exhaust tubes 140 can be compliant and/or flexible tubing which may be required for adjusting the alignment of the any connectors placed along the tubes 140, as described below.

The size and shape of the exhaust tubes 140 can vary depending on the particular application, with factors including the desired flow rate and the properties of the heat exchange medium determining the size and shape of the exhaust tubes 140. The inlet 142 is shown being attached to the heat exchanger 130 along one of its sides, however, the inlet 142 can be attached to heat exchanger 130 at any of a variety of different points about the heat exchanger 130, depending on the particular configuration of the inlet 132 and outlet 134 of the heat exchanger 130.

Between the inlet 142 and the outlet 146, the exhaust tube 120 can include a connector or second connector 144 which allows the exhaust tube 120 to be separated into two portions on either side of the connector 144. The connector 144 can include a valve, or valves, to prevent or limit any leakage of the heat exchange medium. The connector 144, along with the connector 124 on the intake tube 120, allows the heat exchanger 130 to be removed from cooling system 100, without removing the rest of the cooling system 100 from the card 160. As a result, the heat exchanger 130 may be removed to facilitate access to the device 170 or structure being cooled, i.e. the MCM, as shown. Also, with the heat exchanger 130 and the device 170 being mounted to each other in an integrated unit, as detailed below, the connector 144 facilitates the removal of the unit from the card 160. The connector 144 can be a quick-disconnect connector such as a QD connector available from Eaton Aeroquip, Inc. located in Maumee, Ohio. The use of such a quick-disconnect further reduces the time and effort need to disconnect the tube. In turn, this further reduces the service time and equipment down time. In some embodiments, the connector 144 is referred to as an inlet cold plate connector.

The exhaust manifold 150 functions to collect an outgoing flow of the heat exchange medium from the exhaust tubes 140 to be sent out of the system 100. The heat exchange medium can be sent to a coolant receptor. The exhaust manifold 150 includes a common or collection region 152, openings 154, and an open end 156. The general direction flow of the heat exchange medium through the exhaust manifold 150 is shown by the arrow A5.

Depending on the embodiment, the exhaust manifold 150 can be mounted on the card 160, or positioned over or adjacent to the card 160. With the exhaust manifold 150 mounted on to the card 160, the heat exchange system 100 and the card 160 are a single unit. This makes installation, removal and servicing of the combined unit easier and quicker, reducing the time and cost of maintenance and repair.

The collection region 152 can direct the heat exchange medium to an external device (not shown), such as a cooling system, a refrigeration unit, a heat exchanger, a heater, pump, reservoir or the like. The specific size and shape of the collection region 152 can vary and depending on factors including the flow rates, and the properties of the heat exchange medium, i.e. pressure, compressibility, viscosity, and the like. In some embodiments, such as that shown, the collection region is significantly larger in cross-section than the openings 154 and the opening of the open end 156.

The openings 154 are positioned along the exhaust manifold 150 and function to allow flow to be directed from each of the exhaust tubes 140 attached thereto into the collection region 152. While shown being positioned along a common side of the exhaust manifold 150, in other embodiments the openings 154 can be on other sides, or about the manifold 150. While the size and shape of the openings 154 can vary, to achieve an even flow through each of the openings, the openings 154 typically have a common size and shape. The particular size and shape of the openings 154 is dependent on the particular application and can vary depending on factors including the desired flow rate through the openings 154, and the properties of the heat exchange medium, as noted above.

The exhaust manifold 150 also includes an open end 156. The open end 156 has an opening 157 which allows the flow of heat exchange medium from the manifold 150 to an external location (not shown). The size and shape of the opening 157 can vary depending on the embodiment, and on factors including the flow rate and the properties of the heat exchange medium. The open end 156 can also include a connector or exhaust connector 158, which functions to attach the tube or hose to the external location to the exhaust manifold 150. The connector 158 can include a valve, or valves, to prevent or limit any leakage of the heat exchange medium. The connector 158 can also be positioned away from the open end 156 along the tube to the external source. The connector 158 can be a quick-disconnect connector to allow the external tube to be relatively quickly disconnected from the exhaust manifold 150. Such a quick-disconnect connector, in conjunction with the connector 118 on the intake manifold 110, facilitates the quick removal of the card 160 from a test head, or any similar apparatus. This in turn allows for reduced service time and less equipment down time. Also, this provides more flexibility in allowing individual cards to be serviced with impacting other cards in the equipment.

Depending on the embodiment of the present invention, the card 160 can be a channel card or a printed circuit board. The device 170 can be an electronic component, such as a multichip module, or MCM, having pin electronics dies.

An example of a cooling apparatus or cooling plate is set forth in U.S. Pat. No. 5,871,042, entitled LIQUID COOLING APPARATUS FOR USE WITH ELECTRONIC EQUIPMENT, by Gutfeldt, et al., issued Feb. 16, 1999, which is hereby incorporated reference in its entirety.

Figure 2:
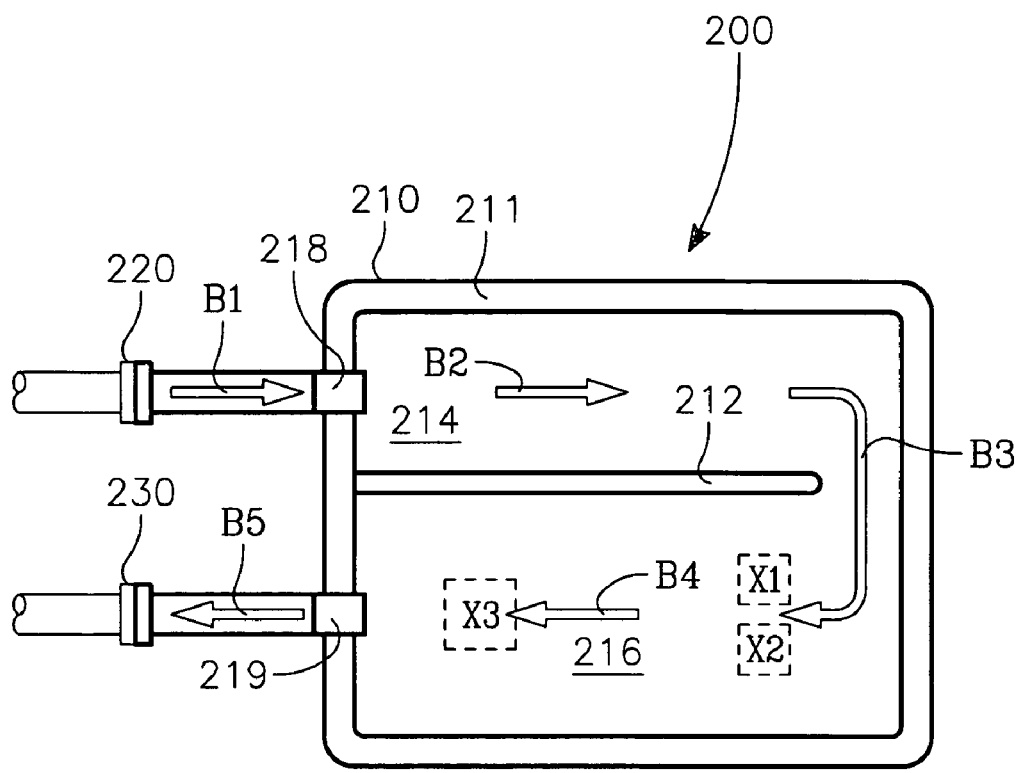
FIG. 2 shows a top cut-away view of a portion of a heat exchange system in accordance with at least one embodiment of the present invention.

FIG. 2 shows a top cut-away view of a portion of a heat exchange system in accordance with at least one embodiment of the present invention. A heat exchanger or cooling plate or cold plate 200 includes a structure 210, a inlet or intake connector 220 and a outlet or exhaust connector 230. The general flow direction of a heat transfer medium (not shown) shown by the arrows B1, B2, B3, B4 and B5. The cooling plate 200 can be removed from the rest of the heat exchange system by the connectors 220 and 230 for repair, maintenance or replacement of the cooling plate and/or the device (not shown) that it is cooling.

In the embodiment shown, the structure 210 of the cooling plate 220 includes an external frame 211, a divider 212, channel 214, a lower plate 216, an upper plate (not shown), an inlet 218 and an outlet 219.

The external frame 211 and the divider 212 form the channel 214, which directs the coolant through the cooling plate 200, as shown generally by arrows B2, B3 and B4. One example of how the flow can be directed to selectively flow first over certain regions, which are positioned above particular components of the device being cooled, is shown in FIG. 2. A variety of other embodiments with different internal flow patterns are possible by reshaping and rearranging the frame 211, the divider 212 and the channel 214.

In the embodiment of the present invention shown in FIG. 2, the divider 212 functions to direct the flow such that it first flows over the regions X1 and X2 then on to region X3. The regions X1, X2 and X3 can show the positions of components, i.e. chips or dies, of the device set below the cooling plate 200. In some embodiments, the regions X1 and X2 locate pin electronics dies and the region X3 locates a digital ASIC chip. In these embodiments, since pin electronics dies are typically more sensitive to temperature levels, and variations thereof, than digital ASIC chips, the flow of the coolant is directed first over the regions X1 and X2. In certain embodiments, the pin electronics dies are most sensitive to temperature effects along a specific edge of the die. By setting this edge of the die as the leading edge, relative to the flow of the heat transfer medium, the sensitivity of the die to heat can be minimized.

As a result, with the embodiment of FIG. 2, uniform cooling can be provided to the pin electronics dies in each of the devices, i.e. MCMs, being cooled by each of the cooling plates 200 of a heat exchange system.

Below the channel 214 is the lower plate 216 and above the channel an upper plate (not shown in the cut-away of FIG. 2). The lower plate 216 can be a heat transfer plate, which can be of a material which allows a high rate of heat transfer, such as copper, brass, aluminum and the like.

The structure 210 also includes the inlet 218 and the outlet 219 for allowing the flow into and out of the cooling plate 200. Positioned upstream from the inlet 218 is the inlet connector 220 and positioned downstream from the outlet is the outlet connector 230. The connector 220 and 230 can also be positioned in contact with, or part of, the structure 210. The connectors 220 and 230 can include a valve, or valves, to prevent or limit any leakage of the heat exchange medium. In some embodiments, the inlet connector 220 and the outlet connector 230 are quick-disconnect connectors to facilitate the removal of the cooling plate 200 from the heat exchange system. Using quick-disconnect connectors allows for a reduction in the time need to remove the cooling plate 200, reducing time need for servicing and equipment downtime. Usable quick-disconnect connectors include as QD connectors available from Eaton Aeroquip, Inc. located in Maumee, Ohio.

In certain embodiments of the present invention, the cooling plate 200 of FIG. 2, can be used as the heat exchanger 130 in the heat exchange system 100 of FIG. 1.

Figure 3:
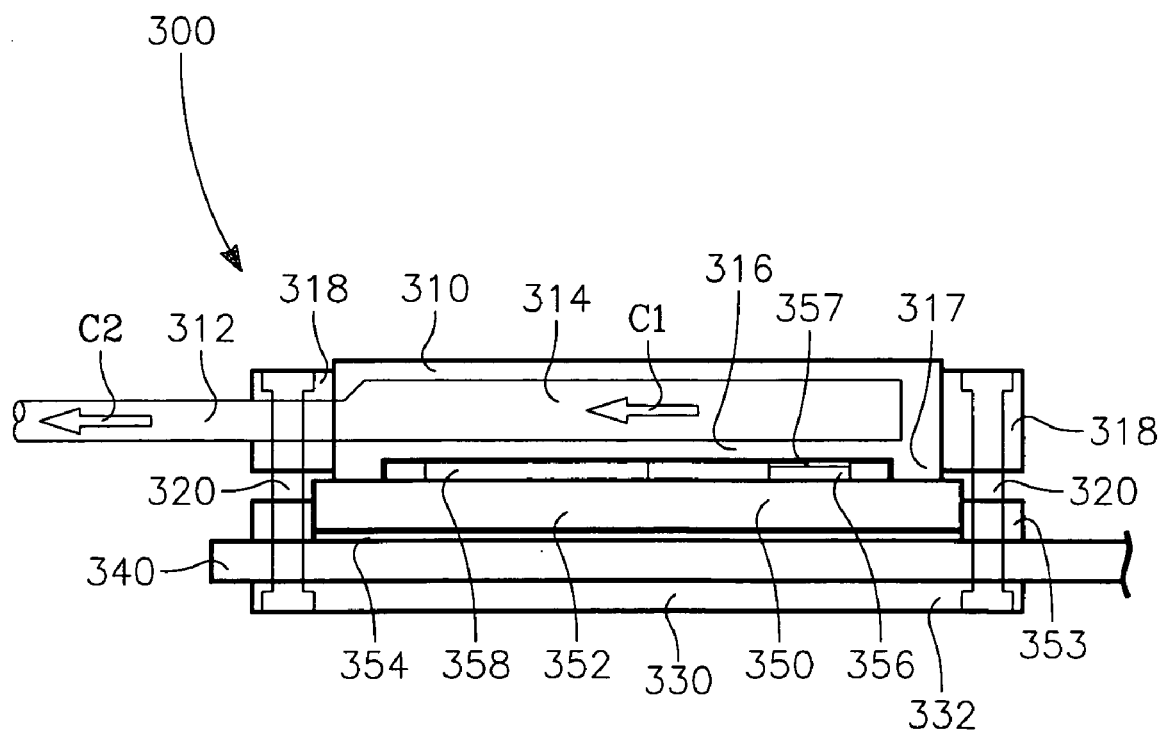
FIG. 3 shows a side view of a portion of a heat exchange system in accordance with at least one embodiment of the present invention.

FIG. 3 shows a side cross-sectional view of a portion of a heat exchange system in accordance with at least one embodiment of the present invention. The embodiment shown in FIG. 3 is an integrated unit 300 that includes a heat exchanger 310, fasteners 320, a backing or bolster plate 330, a card or device board 340 and a device 350. Flow of a heat exchange medium is generally shown by arrows C1 and C2.

With the heat exchanger 310, the device board 340 and the device 350 all secured together by the fasteners 320, the integrated unit 300 provides several functions. With the heat exchanger 310 and the device 350 abutted, the transfer of heat therebetween is facilitated. Since the heat exchanger 310 is secured over the device 350, the heat exchanger 310 also functions as a lid for the device 350, protecting its components. Also, with the fasteners 320 urging the heat exchanger 310 down against the device 350, the heat exchanger 310 can function as a compression plate to secure the device in the board 340. As a result, by using the heat exchanger 310 as not only a heat exchanger, but also a lid and a compression plate, the integrated unit 300 eliminates the need for additional components, reducing cost and complexity.

The heat exchanger 310 includes an outlet 312, a chamber 314, a heat exchange plate 316, feet 317 and mounts 318. The heat exchanger 310 is capable of transferring heat between the device 350 and the heat transfer medium (not shown) flowing through the heat exchanger 310. The size and shape of the heat exchanger 310 can vary depending on the requirements of the particular application. For example, the size of the heat exchanger 310 can be directly dependent on the amount of heat that must be transferred from the device 350 and the surface area available for the heat transfer. As shown, the heat exchanger 310 is a cold plate.

The heat exchanger 310 can be of any of a variety of different materials which allow heat transfer, including materials with high heat transfer rates such as copper, brass, aluminum and the like. The heat exchanger 310 can be a composition of different materials, for instance, a material with high heat transfer properties can be used at locations where heat transfer occurs, such as the heat exchange plate 316, and a different material used for other portions, such as an thermal insulating material at the external areas. This composition of materials would allow greater heat transfer and reduce potential for adverse effect such as condensation.

The heat exchange medium flows through the heat exchanger, entering at an inlet (not shown), passing through the chamber 314 and exiting by an outlet 312. The chamber 314 can be formed to direct the heat exchange medium within the heat exchanger 310. For instance, the chamber 314 can be formed to direct the flow so that it initially passes over the most heat producing and/or sensitive components of the device 350. In some embodiments, the flow is directed to pass over the pin electronic dies. The chamber 314 can also include fins or similar structures to increase the surface area and aid in heat transfer.

Positioned between the heat exchange medium in the chamber 314 and the components of the device 350 is the heat exchange plate 316. To facilitate heat transfer the heat exchange plate 316 can be formed to be in direct contact with the components of the device 350. Also, the heat transfer plate can be of a material having good heat transfer characteristics, including, copper, brass, aluminum and the like. The heat transfer plate can be placed away from the device 350, as shown, by a set of feet 317, which can also act to seal the space between the heat transfer plate and the device 350.

The heat exchanger 318 can also includes mounts or a set of plate ears 318 for receiving the fasteners 320 and allowing the heat exchanger to be secured to the rest of the unit 300.

The fasteners 320 are positioned between the heat exchanger 310 and the bolster plate 330. The fasteners 320 function to urge the heat exchanger 320 as a compression plate down against the device 350, and the device 350 into the device board 340. Not only does this compression aid in heat transfer between the heat exchanger and the device 350, but as further detailed below, by pressing the device 350 into the device board 340, electrical contact between the device 350 and the device board 340 can be facilitated. The fasteners 320 can be compression bolts or similar articles.

The bolster plate 330 is positioned below the device board and functions as compression plate.

In certain embodiments, the device board 340 is a printed circuit board or a channel card. The device board 340 can function not only to hold the unit 300, but it also can act supply electrical connections to the device 350. As noted above, the device board can also be used to mount intake and exhaust manifolds (not shown) for the heat exchange system.

The device 350 includes a body 352, a frame 353, an interface 354, a first component 356 and a second component 358. In certain embodiments the body 352 is a multi-chip module or MCM, where one or more chips or dies are mounted thereto. The frame 353 can function to contain the interface 354, particularly where, described below, a deformable material is used for the interface 354. In some embodiments, the interface 354 is a conductive elastomer which provides electrical connections between the device board 340 and the body 352 including its components 356 and 358. One such conductive elastomer is MPI available from Tyco, Inc. of Attleborough, Mass. in a Kapton film available from Tyco, Inc. of Attleborough, Mass.

In at least one embodiment of the present invention, as the MCM is urged against the printed circuit board, by the actions of the heat exchanger and the bolster plate as compression plates and the compression bolts, the conductive elastomer is deformed and electrical connections are formed between the MCM and printed circuit board.

In other embodiments, the interface 354 can be a set of pins or other leads extending either from the body 352 or the device board 340 to contact either the device board 340 or the body 352, respectfully. Such pins or leads can be secured by conventional means, such as by soldering.

Depending on the embodiment of the present invention, the first component 356 can include one or more pin electronics dies. Since in ATE applications pin electronics dies tend to be sensitive to temperature levels and variations thereof, at least more than other chips, such as digital ASIC chips, the pin electronics dies are typically positioned furthest upstream, relative to other chips in the MCM. That is, the pin electronics dies are positioned to be cooled first by the coolant to assure that they are cooled by the most uniform coolant. To aid in the heat transfer between the pin electronics dies and the heat exchange plate 316 a thermal paste 357 can be applied therebetween. An example of a suitable thermal paste is ATC 3.8, which is available from IBM, Inc. of East Fishkill, N.Y.

In certain embodiments of the present invention, the second component 358 can be a digital ASIC chip. As noted above, since digital ASIC chips tend to be less temperature sensitive than pin electronics dies, the digital ASIC chips can be positioned downstream in the flow of the coolant from the pin electronics dies.

In other embodiments of the present invention, the cooling plate 200 of FIG. 2 can be used as the heat exchanger 310 of the integrated unit 300 of FIG. 3. Also, the integrated unit 300 can be used in the heat exchange system 100 of FIG. 1.

Figure 4A:
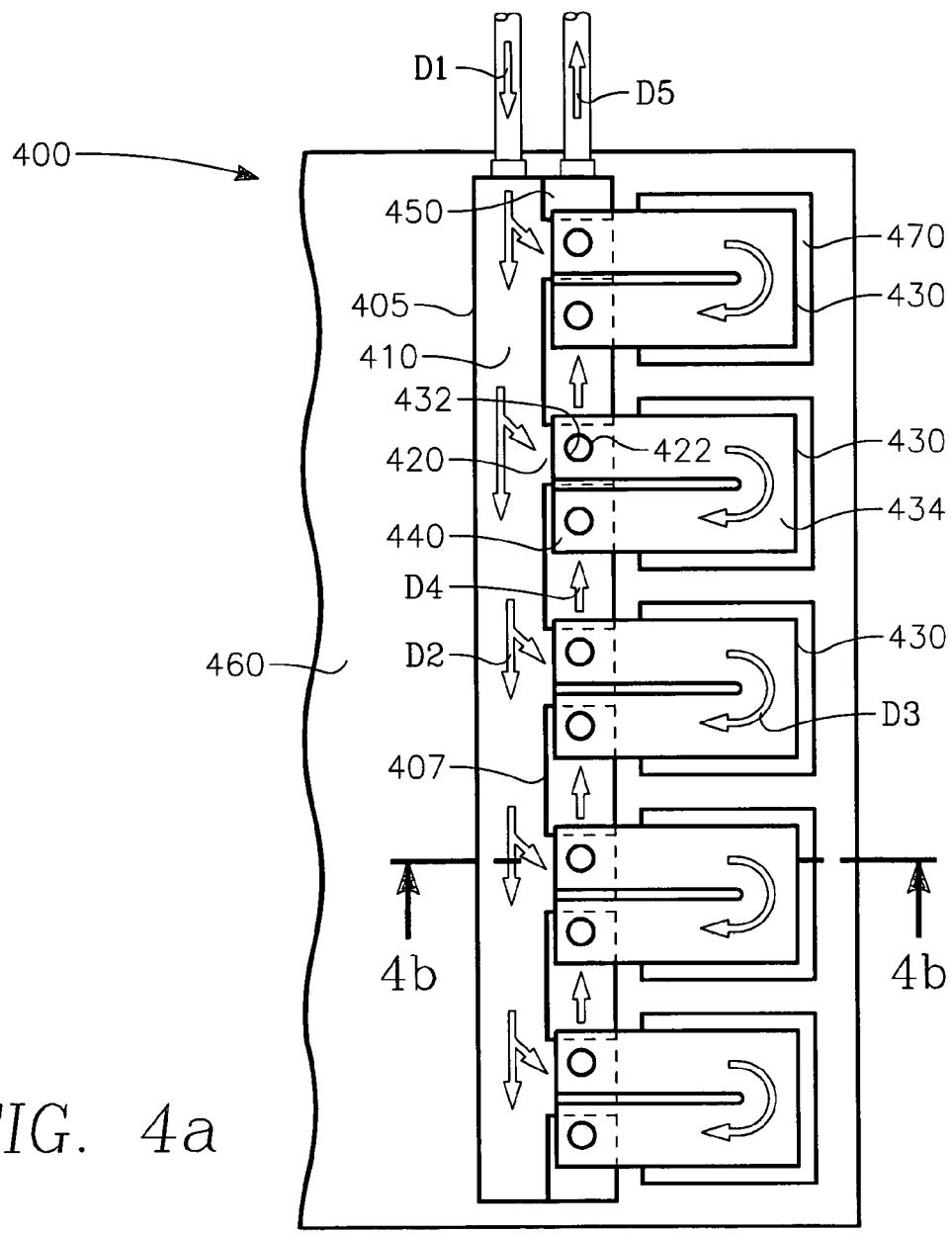
FIG. 4a shows a top cut-away view of a heat exchange system in accordance with at least one embodiment of the present invention.
Figure 4B:
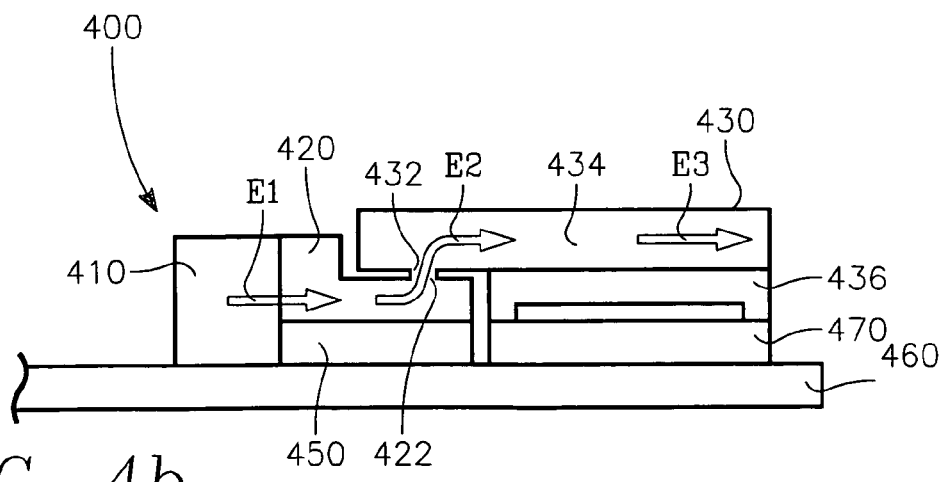
FIG. 4b shows a side cut-away view of a portion of a heat exchange system in accordance with at least one embodiment of the present invention.

FIG. 4a shows a top cut-away view of a cooling system in accordance with at least one embodiment of the present invention. FIG. 4b shows a side cut-away view of a portion of a heat exchange system in accordance with at least one embodiment of the present invention. The embodiment shown in FIGS. 4a and b is a cooling system 400 that has a single manifold 405 mounted on the board 460, for cooling a set of electronic devices 470. The combination manifold 405 includes an intake manifold 410 and an exhaust manifold 450, which are separated from each other by a flow separating structure 407 positioned within the combination manifold 405. The separating structure 407 functions to divide the intake manifold 410 from the exhaust manifold 450, so to not allow mixing of the intake and exhaust flows of the heat transfer medium (not shown).

Connected along the combination manifold 405 are a set of cooling plates or cold plates 430 which in turn are positioned on the set of devices 470. The manifold 405 and cooling plates 430 each have a set of openings that are aligned to allow the heat transfer medium to flow from the intake manifold 410 through the cooling plates 430 and out into the exhaust manifold 450. The flow of the heat exchange medium is generally shown by the arrows D1, D2, D3, D4 and D5 in FIG. 4a and E1, E2 and E3 in FIG. 4b.

The heat exchange medium can be any of a variety of substances including a gas or a liquid. In some embodiments the heat exchange medium is an inert liquid.

The separating structure 407 is shaped to direct the flow of the heat exchange medium from the intake manifold 410 to the cooling plate 430 and out of the cooling plate 430 into the exhaust manifold 450. The separating structure 407 forms an intake passage 420 which directs flow from the intake manifold 410 to an opening 422, which abuts an opening 432 of the cooling plate 430, as shown in FIG. 4b. In this manner the flow of the heat exchange medium (not shown) can move from the intake manifold 410 into the intake passage, as shown generally by arrow E1, then through the openings 422 and 432 into a chamber 434, as shown generally by arrow E2, and then over a heat transfer plate 436, as shown generally by the arrow E3. Since FIG. 4b is a cross-section, as defined in FIG. 4a, the return path and exit of the flow are not shown in FIG. 4b.

With the openings 422 and 432 positioned adjacent each other, a variety of different means and structures can be use to form a seal between the openings 422 and 432. In at least one embodiment an O-ring, positioned between the combination manifold and the cooling plate 430, is used. Also, a quick-disconnect connector can be used between the openings 422 and 432. Such a connector can include a valve, or valves, to prevent or limit any leakage of the heat exchange medium.

In certain embodiments, the cooling plate 430 can be removed from both the combination manifold 405 and the device 470 to allow for access to the device 470 for servicing, repair or replacement. In some embodiments, the cooling plate 430 is secured to the board 460 such that it is capable of also functioning as a lid for the device 470 and/or a compression plate. Some of these embodiments are described above in reference to FIG. 3.

The present invention can also be used to supply a heat exchange medium to more than one card or board by using an intake manifold and an exhaust manifold positioned at least adjacent to the set of cards, with intake and exhaust tubes connecting the manifolds to the cards. In turn, the cards can each have intake and exhaust manifolds for supplying the heat exchangers mounted thereto. This dual parallel heat exchange system provides not only consistent and predictable cooling to each of the components on a given card, but also to each of the cards in a set of cards.

While the present invention can be used in a variety of ATE applications, the invention is also capable of being used in many other non-ATE applications as well. In at least some embodiments, the invention can be employed in applications such as servers, where, for example, 1U size boards, i.e. 1.75" tall, have typically at least 2× processors and preferably 4×. The invention's cooling and fluid distribution allows desired modularity and flexibility in serving individual processors of such applications.

Having described this invention in connection with a number of embodiments, modification will now certainly suggest itself to those skilled in the art. As such, the invention is not to be limited to the disclosed embodiments except as required by the appended claims.

What is claimed is:

1. A heat exchange apparatus comprising:
   a) at least one heat exchanger;
   b) an intake manifold in fluid communication with each heat exchanger of the at least one heat exchanger, wherein the intake manifold is capable of providing a heat exchange medium separately to each heat exchanger;
   c) an exhaust manifold adjacent to the intake manifold, the exhaust manifold being in fluid communication with each heat exchanger of the at least one heat exchanger, wherein the exhaust manifold is capable of receiving the heat exchange medium from each heat exchanger;
   d) a plurality of multichip modules mounted to a card, wherein each multichip module of the plurality of multichip modules is positioned between a heat exchanger and the card, such that heat can transfer between each multichip module and a respective heat exchanger;
   e) the exhaust manifold and the intake manifold positioned above and adjacent to a side of the card; and
   f) the plurality of multichip modules being mounted on the side of the card in a position lateral to the intake manifold and the exhaust manifold.

2. The heat exchange apparatus of claim 1, wherein the intake manifold is capable of providing the heat exchange medium substantially equally to each heat exchanger.

3. The heat exchange apparatus of claim 1, wherein each multichip module abuts at least one heat exchanger.

4. The heat exchange apparatus of claim 3, wherein each multichip module is mounted to at least one heat exchanger.

5. The heat exchange apparatus of claim 3, wherein each multichip module is compression mounted to at least one heat exchanger.

6. The heat exchange apparatus of claim 3, wherein each multichip module further comprises a pin electronics die, and wherein the pin electronics die abuts at least one heat exchanger.

7. The heat exchange apparatus of claim 1, wherein each heat exchanger is a cold plate.

8. The heat exchange apparatus of claim 1, wherein the heat exchange medium is a liquid.

9. The heat exchange apparatus of claim 4, wherein the heat exchange medium is an inert liquid.

10. The heat exchange apparatus of claim 1, further comprising at least one first connector, wherein each first connector of the at least one first connector, is positioned between the intake manifold and each heat exchanger, such that each heat exchanger can be disconnected from the intake manifold.

11. The heat exchange apparatus of claim 1, further comprising at least one first connector, wherein each first connector of the at least one first connector, is positioned between the intake manifold and each heat exchanger, further comprising at least one second connector, wherein each second connector of the at least one second connector, is positioned between the exhaust manifold and each heat exchanger, such that each heat exchanger can be disconnected from the intake manifold and the exhaust manifold.

12. The heat exchange apparatus of claim 11, wherein each first connector comprises a quick-release connector, and wherein each second connector comprises a quick-release connector.

13. The heat exchange apparatus of claim 11, wherein each first connector comprises at least one valve for controlling the flow of the heat exchange medium, and wherein each second connector comprises at least one valve for controlling the flow of the heat exchange medium.

14. The heat exchange apparatus of claim 11, further comprising a combined manifold structure comprising the intake manifold and the exhaust manifold.

15. The heat exchange apparatus of claim 6, wherein the pin electronics die is positioned to be cooled by the heat exchange medium prior to cooling other die within the multichip module.

16. In automated test equipment having a printed circuit board, a plurality of multichip modules mounted to the printed circuit board, a coolant source for providing a liquid coolant, a coolant receptor for receiving a liquid coolant, and a liquid cooling apparatus in fluid communication with the coolant source and the coolant receptor, the liquid cooling apparatus comprising:
   a) a plurality of cold plates, wherein each cold plate of the plurality of cold plates abuts a multichip module of the plurality of multichip modules, each mulitichip module being positioned between the printed circuit board and the abutting cold plate, such that heat is capable of transferring between the multichip module and the abutting cold plate;
   b) an intake manifold positioned above and adjacent to a side of the printed circuit board, wherein the intake manifold is in fluid communication with each cold plate in a parallel configuration, such that the intake manifold is capable of providing coolant to each cold plate separately;
   c) an exhaust manifold positioned above and adjacent to a side of the printed circuit board, wherein the exhaust manifold is in direct fluid communication with each cold plate in a parallel configuration, such that the exhaust manifold is capable of receiving coolant from each cold plate separately; and
   d) the plurality of multichip modules being positioned lateral to and along a common side of the exhaust manifold, and wherein the plurality of multichip modules are positioned lateral to and along a common side of the intake manifold.

17. The liquid cooling apparatus of claim 16, further comprising:
   a) an intake connector mounted between the coolant source and the intake manifold, wherein the intake connector is capable of separating a fluid connection between the intake manifold and the coolant source, such that the liquid cooling apparatus is separable from the coolant source; and
   b) an exhaust connector mounted between the exhaust manifold and the coolant receptor, wherein the exhaust connector is capable of separating a fluid connection between the exhaust manifold and the coolant receptor, such that the liquid cooling apparatus is separable from the coolant source.

18. The liquid cooling apparatus of claim 17, wherein the intake connector comprises a quick-release connector, and wherein the exhaust connector comprises a quick-release connector.

19. The liquid cooling apparatus of claim 16, wherein the intake manifold and the exhaust manifold are mounted to the printed circuit board.

20. The liquid cooling apparatus of claim 19, further comprising a combined manifold structure comprising the intake manifold and the exhaust manifold.

21. The liquid cooling apparatus of claim 17, further comprising a plurality of inlet cold plate connectors, wherein each inlet cold plate connector of the plurality of inlet cold plate connectors, is positioned between the intake manifold and a cold plate of the plurality of cold plates, a plurality of outlet cold plate connectors, wherein each outlet cold plate connector of the plurality of outlet cold plate connectors, is positioned between the exhaust manifold and a cold plate of the plurality of cold plates, such that each cold plate can be disconnected from the intake manifold and the exhaust manifold.

22. The liquid cooling apparatus of claim 21, wherein each inlet cold plate connector comprises a quick-release connector, and wherein each outlet cold plate connector comprises a quick-release connector.

23. The liquid cooling apparatus of claim 16, wherein each multichip module further comprises a pin electronics die, and wherein each pin electronics die abuts at least one cold plate.

24. The liquid cooling apparatus of claim 23, wherein each pin electronics die abuts at least one cold plate with a thermal paste therebetween.

25. The liquid cooling apparatus of claim 16, wherein the multichip module comprises at least one pin electronics chip positioned within the multichip module such that the at least one pin electronics chip is cooled prior to cooling other chips within the multichip module.

* * * * *